Figure 1:
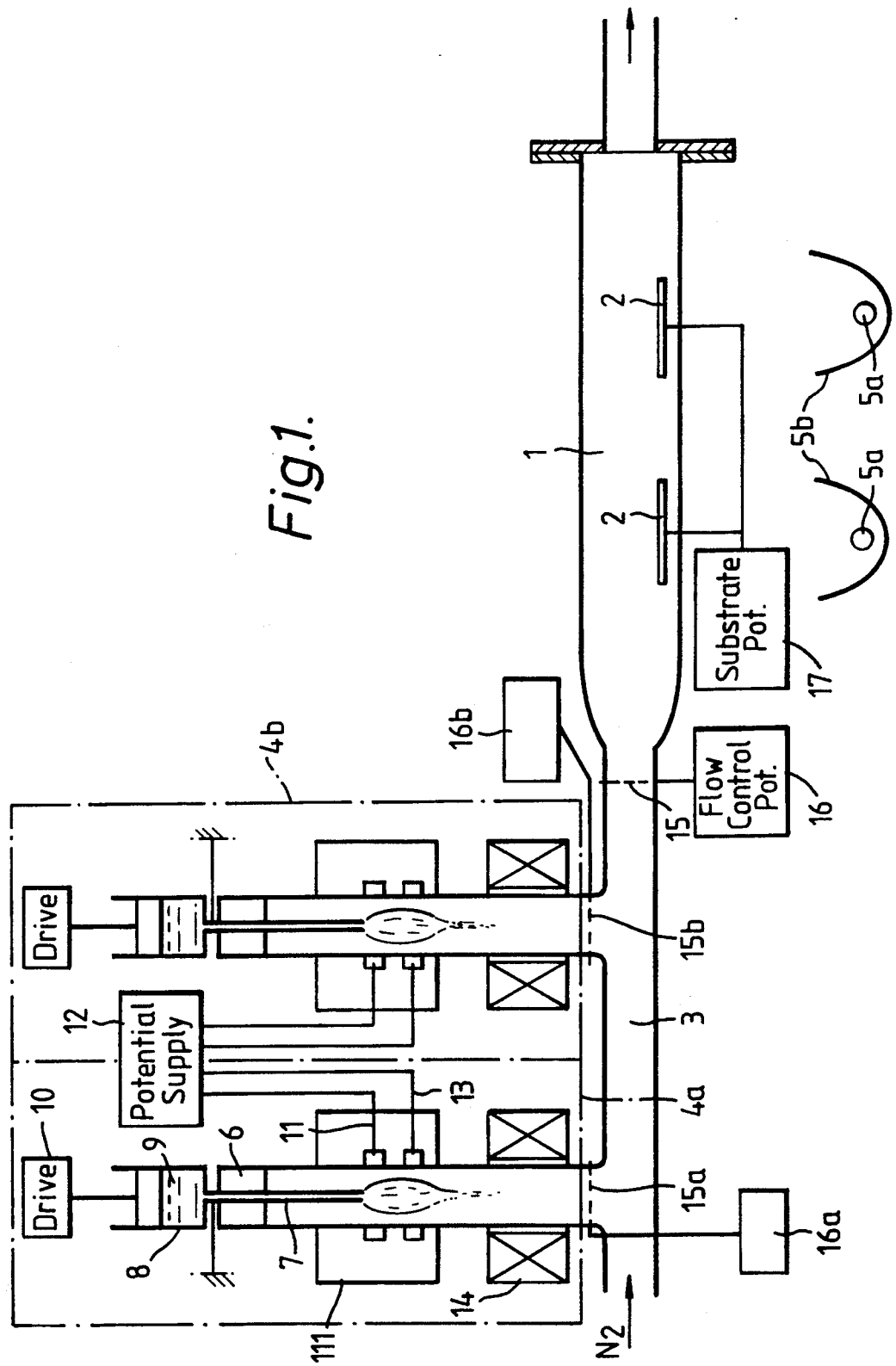

United States Patent [19]

Unvala

[11] Patent Number: 4,993,361

[45] Date of Patent: Feb. 19, 1991

[54] CHEMICAL VAPOR DEPOSITION

[75] Inventor: Bhikhu A. Unvala, London, United Kingdom

[73] Assignee: Unvala Limited, London, England

[21] Appl. No.: 411,226

[22] Filed: Sep. 22, 1989

Related U.S. Application Data

[63] Continuation of Ser. No. 71,517, Jul. 9, 1987, abandoned.

[30] Foreign Application Priority Data

Jul. 11, 1986 [GB] United Kingdom ................. 8616989
Mar. 4, 1987 [GB] United Kingdom ................. 8705062

[51] Int. Cl.$^5$ ................................................ C23C 16/00
[52] U.S. Cl. ................................... 118/723; 118/715; 118/722
[58] Field of Search ......................... 118/715, 722, 723

[56] References Cited

U.S. PATENT DOCUMENTS 3,436,257  4/1969  Myers .......................... 427/29
3,970,037  7/1976  Sopko .
4,571,350  2/1986  Parker et al. .

FOREIGN PATENT DOCUMENTS 0232434  8/1987  European Pat. Off. .
1462335  11/1966  France .

*Primary Examiner*—Richard Bueker
*Attorney, Agent, or Firm*—Klauber & Jackson

[57] ABSTRACT

Precursor (9) is atomized by being ionized (11,12) and is then vaporized (14) prior to deposition. The ionized vapor is controlled by electrodes (2,15) to control its flow and/or its deposition on a substrate.

13 Claims, 4 Drawing Sheets

CHEMICAL VAPOR DEPOSITION

This application is a continuation of application Ser. No. 071,517, filed July, 9, 1987, now abandoned.

The present invention relates to chemical vapour deposition (CVD). It is concerned for example with Metal-Organic Chemical Vapour Deposition (MOCVD) which is also known as Metal-Organic Vapour Phase Epitaxy (MOVPE). An illustrative application of the invention is the manufacture of integrated circuits.

Chemical Vapour Deposition is a known technique for depositing a layer of material onto a substrate. A precursor in liquid form, e.g. dissolved in a solvent, or in the form of a suspension or emulsion is vapourised, and the vapour flows to a chamber containing the substrate, where (some of) the vapour of precursor deposits on the substrate. The substrate is heated and the precursor decomposes to leave on the substrate a layer of the desired material. In MOCVD, the precursor is a metal organic compound of the desired material, which is advantageous because the chemical bonds of such a compound break easily at a relatively low temperature.

An inert carrier gas, e.g. Nitrogen, may be used to transport the vapour from its source to the substrate. The process may be carried out at atmospheric pressure (High Pressure MOCVD) or at less than atmospheric pressure (Low Pressure MOCVD).

Alternatively, the process may be carried out under conditions of near-vacuum.

It is known to produce vapourised precursor in the following way. The dissolved precursor is contained in a medical hypodermic syringe. The needle of the syringe extends through a sealed entrance port of the CVD apparatus. The syringe has a plunger which is driven by an electric stepper motor to introduce a succession of droplets into the apparatus. The droplets are heated in the apparatus to vapourise them. This known method of producing vapourised precursor has the disadvantage that the vapour is produced from a succession of relatively large drops, which are produced, and thus vapourised, at discrete intervals of time, resulting in fluctuations in concentration of the vapour at the substrate.

In accordance with one aspect of the present invention, fluctuations of concentration of vapour of precursor are reduced by continuously atomising and vapourising the precursor.

In accordance with another aspect of the present invention, liquid of precursor to be deposited on a substrate is either continuously atomised and ionised vapour produced from the atomised precursor or the liquid precursor is continuously atomised by being ionised and is then vapourised.

By continuously atomising the liquid precursor and vapourising the atomised precursor, concentration fluctuations are reduced because the atomisation process prevents droplets being formed even when a stepper motor is used.

In the known CVD method and apparatus it is difficult to control the vapour.

According to another embodiment of the present invention, an electric field is used to control the ionised vapour of precursor. Alternatively a magnetic field is used to control the ionised vapour of precursor.

In the known CVD method a carrier gas is used which flows through the CVD apparatus resulting in a relatively high loss of the vapour which is swept out of the chamber. It is also difficult to control the flow of the vapour to the chamber and to control the deposition of the vapour on the substrate. Furthermore, when it is desired to introduce a different precursor into the apparatus it is necessary to wait until the previous precursor has been flushed out of the apparatus.

In another embodiment of the invention, a flow control potential is applied to a flow control electrode in a path along which the vapour to be deposited flows. The flow control potential may be selected to substantially prevent the vapourised precursor from reaching the substrate. Thus, with the use of ionised precursor, it is possible using the flow control electrode to control the flow of ionised vapour. By applying a blocking potential to the electrode, flow of ionised vapour may be stopped quickly, without waiting for the vapour to be flushed out of the apparatus. The ionised vapour of another precursor can then be introduced into a chamber containing the substrate.

In yet another embodiment substrate control potential is applied to the substrate onto which the vapour is to be deposited to control the deposition of the ionised vapour on the substrate.

Thus, with the use of ionised precursor it is possible to control the deposition of the ionised precursor onto the substrate electrically. By applying to the substrate a potential which attracts the ionised vapour to the substrate loss of precursor from the apparatus may be reduced.

Figure 3:
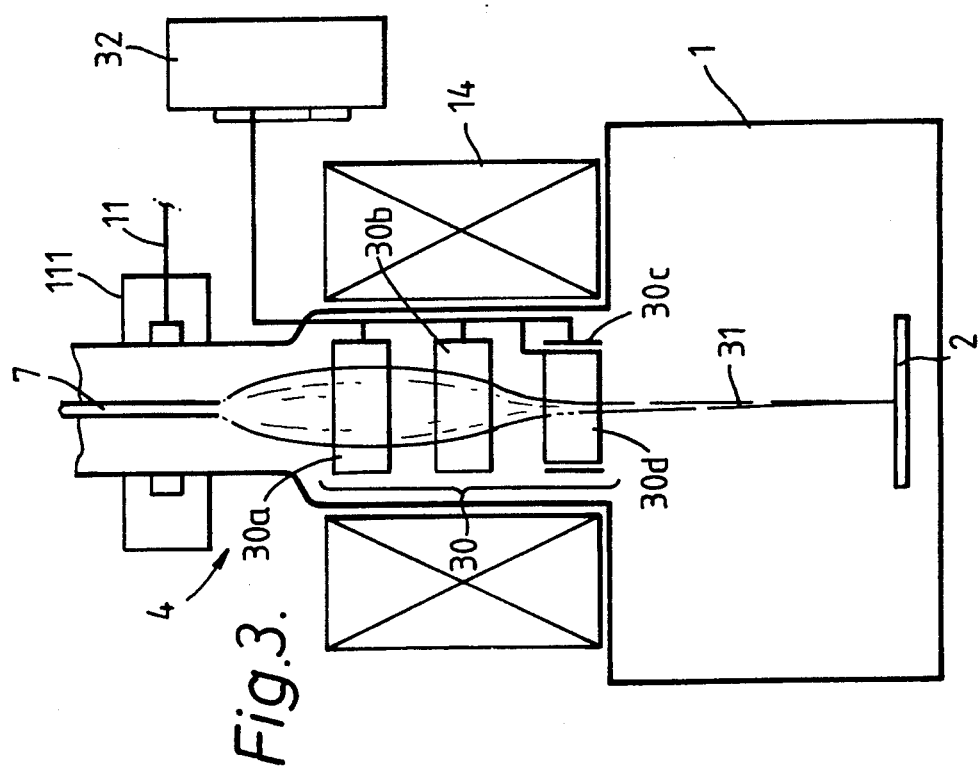
Figure 2:
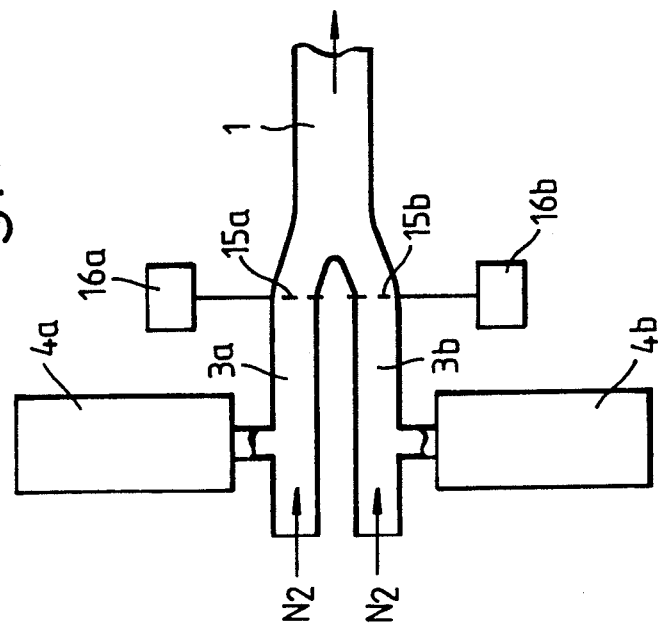
Figure 4:
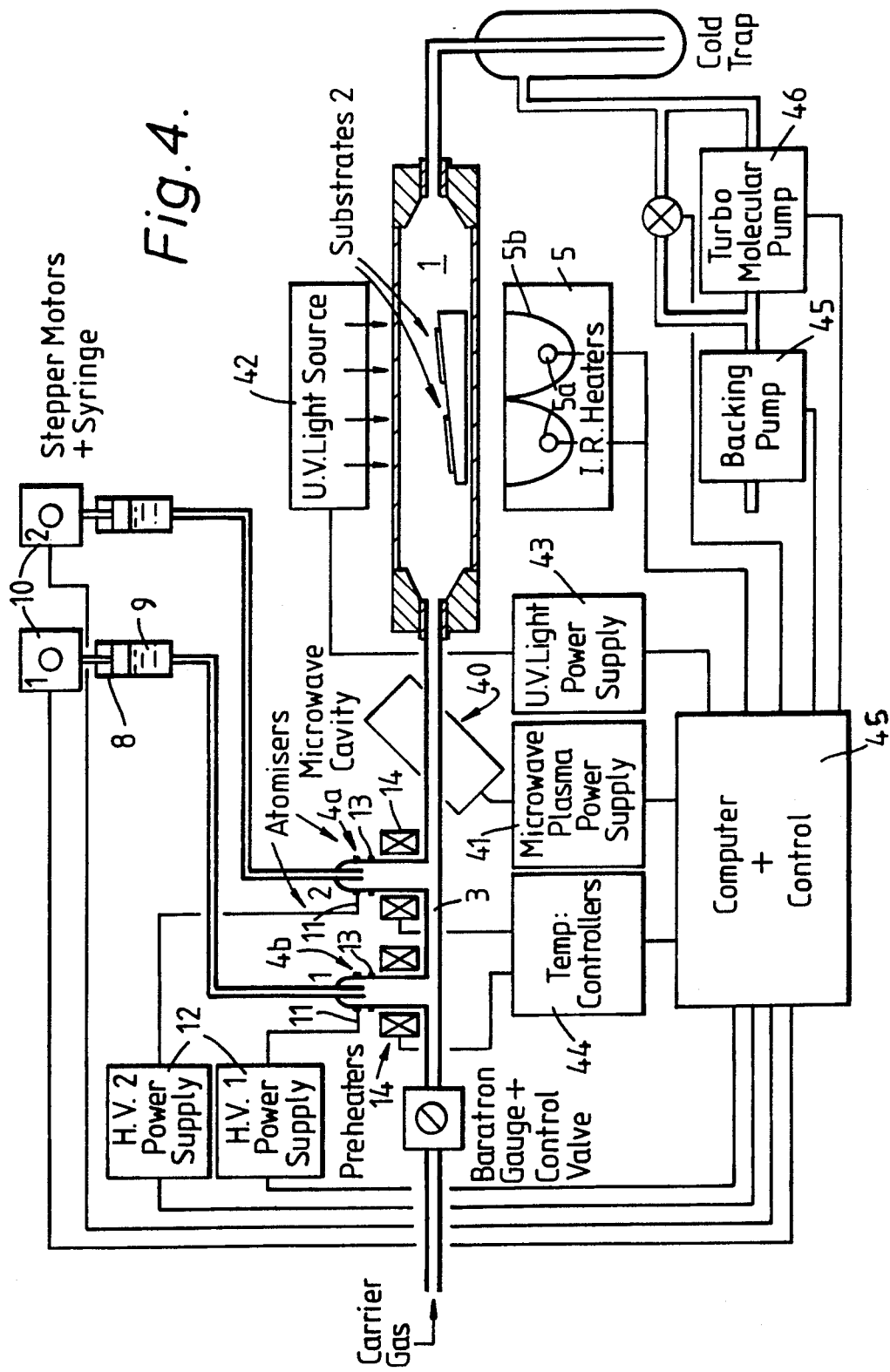
Figure 5A:
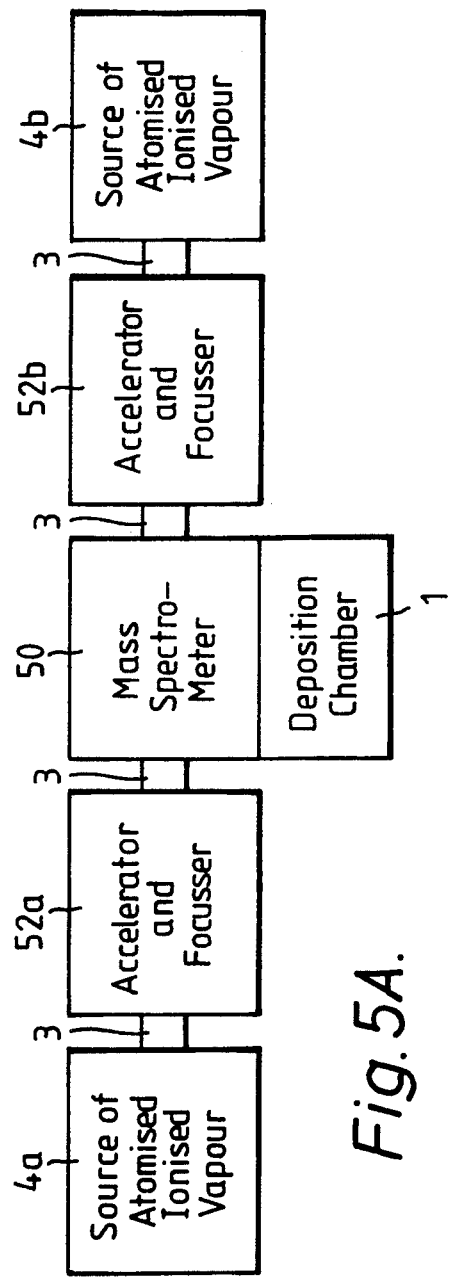
Figure 5B:
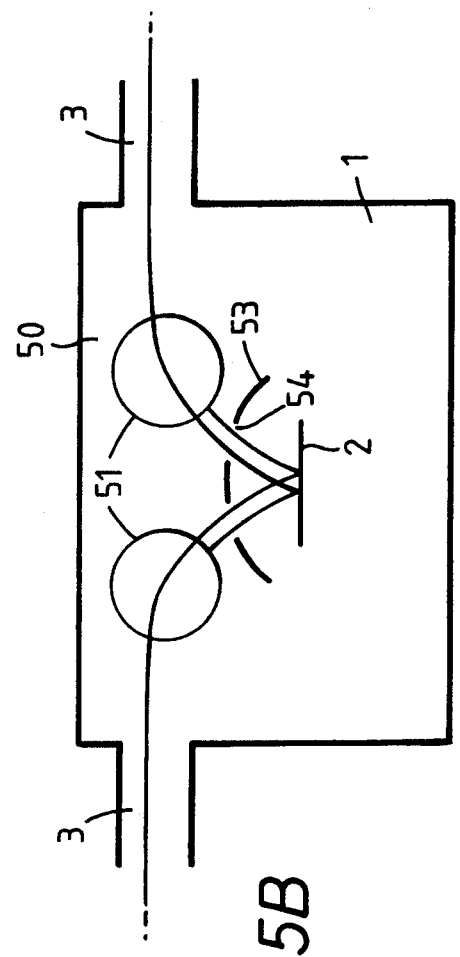

For a better understanding of the present invention, reference will now be made by way of example to the accompanying drawings in which:

FIG. 1 is a schematic diagram (which is not to scale) of an illustrative example of a CVD apparatus in accordance with the invention, FIG. 2 is a schematic diagram (which is not to scale) showing a modification of the apparatus of FIG. 1, FIG. 3 is a schematic diagram (which is not to scale) of a further CVD apparatus in accordance with the invention, FIG. 4 is a schematic diagram (which is not to scale) of another CVD apparatus in accordance with the invention, and FIGS. 5A and 5B are schematic diagrams of a CVD apparatus in accordance with the invention incorporating an ion selection arrangement.

The CVD apparatus shown in FIG. 1 comprises a quartz chamber 1 containing a substrate 2 onto which a desired material is to be deposited. An inert carrier gas such as Nitrogen or Argon flows from a source (not shown) via a vapour flow path 3 into the chamber 1 and then out of the chamber. A source 4a having an exit vapour path connecting to the path 3 provides to the path 3 a vapour of precursor. The vapour of precursor is carried by the carrier gas to the chamber 1 where it is deposited on the substrate 2. The substrate is heated by a heater 5, which in this example comprises an infra red heating element 5a in an elliptical reflector 5b. The precursor thermally decomposes on the substrate to leave a layer of the desired material on the substrate 2.

In FIG. 1, a further source 4b may be used to provide another precursor, also vapourised.

The apparatus may be operated at atmospheric pressure or at less than atmospheric pressure.

The precursor is a compound of the desired material, which decomposes to form the desired material. Examples of precursors and desired materials are known in the art: for example all Halides of the materials to be deposited.

The precursor may be a metal-organic compound of the desired material, such as is known in the art. For deposition of an oxide the precursor is an oxygen containing Metalorganic compound in particular a Metal Alkoxide. For deposition of a Metal the precursor is a Metal Alkyl. For a semiconductor many compounds are known in the art; e.g. for Gallium Arsenide &he precursor is TMGa-AsH$_3$ or TE.Ga-AsH$_3$ where TM is trimethyl and TE is triethyl. In addition adducts of the form Trimethylindium-Trimethylamine adduct and Trimethylindium-Trimethylphosphine adduct may be used.

The substrate may be a semiconductor substrate as used in the manufacture of integrated circuits. For example it may be of silicon, germanium or a group III-V compound such as Gallium Arsenide.

The material deposited on the substrate may be a semiconductor, a metal, a metal oxide, e.g. Al$_2$O$_3$, TiO, a metal nitride, an oxide or nitride of silicon e.g. SiO, SiO$_2$ or Si$_3$N$_4$. The material may also be a material such as Lead Titanate or Lithium Niobate which is an electro-acoustic material used in for example surface acoustic wave devices.

The source 4a (or 4b) comprises a sealed entry port 6 through which the needle of a medical hypodermic syringe extends. The syringe 8 contains the precursor in liquid form 9. For example the liquid precursor may be in the form of a suspension or emulsion. Alternatively the precursor may be dissolved in a solvent. As another alternative the liquid precursor may be in the form of a colloidal solution which allows insoluble materials to be used as precursors. The solvent is an organic material of very low water content and with high volatility as is known in the art, e.g. cyclohexane or benzene. A drive mechanism such as a stepper motor moves a plunger of the syringe to deliver the dissolved precursor. Alternatively gravity feed could be used.

In accordance with an aspect of the present invention, the precursor delivered from the syringe is continuously atomised and formed into an ionised vapour.

In the example shown in FIG. 1, the needle 7 is earthed. An electrostatic induction electrode 11 which is held in a PTFE holder 111 surrounds the glass tube of the entry port 6, and the needle 7. The electrode 11 is energised by a potential supply 12 to minus 10 kV or more to atomise the precursor by positively ionising it, as it is delivered from the needle. The atomised ionised precursor tends to move away from the needle and spread out due to the mutual repulsion of the like positive charges.

A further electrode 13 in the holder is energised to plus 10 kV or more to compress the body of atomised ionised precursor.

The precursor is then heated by heaters 14 to vapourise it. The vapour may be heated to a temperature in the range 70° C. to 300° C. or even higher depending on the precursor and the liquid in which it is dissolved or suspended or with which it forms an emulsion or colloid. If the solvent is cyclohexane the temperature is about 150° C. The heaters are electrical resistance heaters in the examples shown in the Figures. Other suitable heaters may be used.

The vapourised and ionised precursor then flows through the vapour path at the exit of the source into the path 3. The ionised vapour is then carried by the carrier gas along the flow path 3 into the chamber 1.

A flow control electrode 15 is provided in the path 3. It may be for example a conductive mesh extending across the path. By suitably controlling the potential applied to the electrode by a source 16, the flow of the ionised vapour past the electrode 15 is controllable. By applying to the electrode a suitable voltage having the same polarity as the ions produced by the source 4a, e.g. plus 10 kV or more in this example, the positive ions are repelled, stopping their flow to the chamber. Repulsion is preferred because the ions are not deposited on the electrode.

Alternatively by connecting the flow control electrode 15 to ground, or to a negative potential, the positively charged ions of the vapour supplied by source 4a are attracted to the electrode, also with the result that the flow is stopped. However, that has the possible disadvantage that ions which are deposited on the electrode may be released later when their presence in the chamber 1 is not desired.

Thus the flow of ions from the source 4a to the chamber 1 may be stopped, started, and controlled by the use of the flow control electrode.

The substrate 2 is supported on an electrode which may have a control potential applied to it from a source 17 to control the deposition of the ionised vapour on the substrate. For example by applying a negative potential to the electrode and thus the substrate, the positive ions from the source 4a are attracted to the substrate. That has the effect of reducing the amount of vapour of precursor which would otherwise be carried out of the chamber by the carrier gas. Also the amount of precursor which needs to be used may be reduced. Thus there will be less contamination of the interior surfaces of the chamber 1 by precursor.

By applying a suitable positive voltage to the substrate the positive ions may be repelled from the substrate.

As shown in FIG. 1, there are two sources 4a, 4b of ionised vapourised precursor. As described above, source 4a is used and it produces positive ions and flow control is performed only using the electrode 15 near the entrance of the chamber 1.

In a modification of the apparatus of FIG. 1 as so far described instead of providing one flow control electrode in the path 3, two electrodes 15a, 15b and potential sources 16a, 16b may be used in the respective vapour paths at the exits of the sources 4a, 4b to separately and independently control the flow of ions from the sources into the path. In addition the electrode 15 may be used as well to control the flow of vapour into the chamber 1.

In an alternative arrangement, shown in FIG. 2 the sources 4a and 4b are coupled to the chamber 1 by separate flow paths 3a, 3b. Each path is provided with its own electrode 15a, 15b and potential supply 16a, 16b. Thus the flow of ionised vapour from the sources 4a, 4b is separately and independently controllable.

The sources 4a, 4b could be operated to produce positive and negative ions respectively. The potential applied to the substrate may be controlled so as to repel the positive ions from source 4a and attract the negative ions from source 4b and vice/versa.

Referring to FIG. 3 yet another CVD apparatus is shown. The apparatus has a source 4 of vapourised ions of precursor. The source includes a hypodermic syringe having a plunger driven by a suitable drive (not shown). Precursor delivered by an earthed needle 7 is atomised by being ionised. For that purpose an electrode 11 held in a PTFE holder 111 is energised to 10 kV or more. The atomised and ionised precursor is vapourised by a heat source 14.

In the apparatus of FIG. 3, a set of electrodes 30 are provided for forming a focussed beam 31 of ions which is directed onto, and may be scanned across, a substrate 2. The electrodes are individually energised by suitable energising means 32, via respective connections.

The set 30 of electrodes comprises electrodes 30a and 30b for focussing and accelerating the ions of precursor, and two pairs of electrodes 30c, 30d for scanning the focussed beam of ions across the substrate. The beam of ions is controlled to selectively deposit the precursor where required on the substrate 2 by scanning the beam path across the substrate and cutting off the beam as necessary.

In the apparatus of FIG. 3, the set of electrodes 30 may be replaced by magnetic coils for magnetically forming the beam and scanning it across the substrate.

FIG. 4, shows a further CVD apparatus in accordance with the invention. Various items of the apparatus of FIG. 4 are the same as items of the apparatus of FIG. 1 and are referenced with the same numerals in both figures. These items will not be further described.

The apparatus of FIG. 4 has, in addition to the ionising electrode 11 which ionises and atomises the precursor 9, a further ioniser 40. The ioniser 40 is provided to ensure complete ionisation of the precursor. Complete ionisation is preferable and may not reliably occur with only one stage of ionisation. In the apparatus of FIG. 4, the ioniser 40 comprises an RF, in this example a microwave, cavity to which RF or microwaves are supplied from a supply 41. The additional ioniser 40 is provided in the flow path 3.

Other forms of ioniser could be used: For example, a further induction electrode like electrode 11 could be used, or a corona discharger could be used, yet further, the already ionised precursor could be passed through an election beam or passed through an arc discharge chamber to effect the further ionisation.

The further ioniser could be arranged within the source 4a or 4b.

The apparatus of FIG. 4 is illustrated without flow control electrodes 15, 15a, 15b and potential source 16, 16a, 16b or sources of substrate potential control 17. Such electrodes and sources may be provided in the apparatus of FIG. 4.

The apparatus of FIG. 4 has an ultraviolet light source 42 together with a power supply 43 for irradiating the substrates 2. It also has temperature controllers 44 for controlling the heaters 44. A computer and control arrangement 45 controls the power supplies 12, 41, 43 controllers 44 heaters 5, pumps 45 and 46, and stepper motors 10.

FIG. 5A shows yet another CVD apparatus in accordance with the invention. The apparatus comprises first and second sources 4a and 4b of atomised, ionised vapourised precursor. Each source is as described above in which precursor 9 from a stepper motor driven syringe 8 is atomised by being ionised and is then vaporised and, if preferred, further ionised.

The ionised vapour from each source 4a, 4b is accelerated and focussed in an ion accelerating and focussing arrangement 52a, 52b. Such arrangements are known. One example is an Einzel lens arrangement. The focussed beam of ionised vapour is then supplied to an ion selector 50 which is, in effect, a mass spectrometer. The purpose of the ion selector 50 is to purify the ionised vapour before it is deposited on the substrate 2.

As is known in mass spectrometry, ionised vapour is passed through a magnetic field produced by magnets or electromagnets 51. The ionised vapour beam is bent through an angle dependent (amongst other parameters) on the mass of the ions. A barrier 53 with a small opening is placed between the substrate 2 and the magnets or electromagnets 51 to allow only ions of the correct mass to pass to the substrate 2. Impurities, which would have a different mass to the ions of the desired material would be deposited on the barrier. By providing two or more sources 4a, accelerators 52, selectors 50 and openings 54 in the barrier 53 two or more chemicals can be simultaneously deposited on the substrate. For example, one source 4a may include trimethyl Galllium and the other 4b may include Arsane AsH$_3$, to form Gallium Arsenide on the substrate.

In one modification of the apparatus of FIGS. 5A and 5B only one source 4, acclerator and focussor 52 and selector 50 are provided.

In another modification, and in accordance with a yet further aspect of the invention one or each source 4 is replaced by means for producing a beam of ions from a solid element or compound, e.g. Gallium and/or Arsenic. The ion beam current can be controlled electronically very precisely. That is particularly useful when group III V compounds are to be deposited, as it allows precise control of the amounts of each element which are deposited. In a further modification the magnets or electromagnets 51 are replaced by means for producing an electric field or by means for producing magnetic and electric fields.

Various modifications may be made to the above described embodiments. For example instead of directly atomising the precursor by ionising it alternatives may be used.

In one such alternative, the precursor delivered by the needle is ultrasonically atomised by for example a piezo-electric device attached to the needle.

The atomised precursor may then be ionised and then vapourised as described hereinbefore. In another alternative the atomised precursor is vapourised before being ionised.

The chamber 1 may be of stainless steel or Aluminium (or any other material known in the art to be suitable) instead of quartz.

The solvent in which the precursor is dissolved may be Methanol for those precursors for which it is suitable as known in the art.

The drive mechanism 10 may be a precision liquid dispenser which operates by producing controlled pulses of air pressure to displace liquid from a disposable syringe.

Instead of using an induction electrode 11 energised to a high voltage of opposite polarity to the ions to be produced and earthing the needle 7, the needle may be energised to a high potential with the same polarity as the ions to be produced to produce the ions by direct ionisation. That however is disadvantageous because the syringe and its contents are not at earth potential.

Although the invention has been described with the illustrative example of positive ions, negative ions may be used.

In order to deposit oxides, e.g. metal oxides on the substrate 2, the precursor 9 may be an oxygen containing Organo-metallic compound e.g. a metal alkoxide. Alternatively an organo-metallic precursor 9 may be used together with a separate source of Oxygen e.g. an ionised beam of oxygen or oxygen in gaseous form.

Various further modifications are possible within the scope of the invention. For example, instead of the arrangement shown in FIG. 5*b* for purifying the vapour, the ionised vapour could be passed along a conduit which branches into two passageways one of which is for receiving the purified vapour and the other for receiving waste products, a field being provided in the region of the branch so as to direct the vapour and the waste products into the respective correct passageway utilising the difference in mass of these substances.

As will be understood from consideration of the foregoing description, the illustrated embodiments achieve atomisation electrostatically. This method of atomisation results in ionisation of the atomised precursor and, after vapourisation, the ionised precursor can be controlled utilising electrical and/or magnetic fields. This combination of features is highly advantageous resulting in an inexpensive apparatus and method in which control, uniform deposition of precursor vapour on the substrate is efficiently achieved. The invention, however, also extends to modifications of this process and arrangement. For example, other means for atomising the liquid could be used instead of an electrostatic field, particularly where it is not desired to produce ionised vapour.

I claim:

1. Apparatus for performing chemical vapour deposition, comprising:

electrostatic means for atomising and ionising a liquid precursor, means for vapourising the atomised ,ionised precursor, said means for vapourising including heater means for vapourising said atomised, ionised precursor by heating said atomised, ionised precursor, and means for depositing the vapourised precursor on a surface.

2. Apparatus according to claim 1, wherein said heater means is positioned between said electrostatic means and the surface.

3. Apparatus according to claim l comprising further ionising means for ionising unionised vapour from said first-mentioned ionising means.

4. Apparatus according to claim 1 comprising means for producing an electric field and arranged to control the ionised vapour of precursor.

5. Apparatus according to claim 1 comprising means for producing a magnetic field and arranged to control the ionised vapour of precursor.

6. Apparatus according to claim 4 comprising means for producing a deposition control potential for controlling the deposition of the ionised vapour on the substrate.

7. Apparatus according to claim 6 comprising means for applying a deposition control potential to the substrate onto which the chemical is to be deposited, to control the deposition of the ionised vapour on the substrate.

8. Apparatus according to claim 4 wherein a flow control electrode is provided in a vapour flow path between the producing means and the substrate and means are provided for applying a flow control potential to the electrode to control the flow of the ionised vapour from the producing means to the substrate.

9. Apparatus according to claim 1 comprising means for forming the ionised vapour into a beam and for directing the beam onto the substrate.

10. Apparatus for preforming chemical vapour deposition, including means for atomising liquid precursor, means for vapourising the atomised precursor, ionising means operable such that said vapour is ionised, means for deposition the vapourised precursor on a surface, and means for selecting, by mass spectrometry, ionised precursor to be deposited on the substrated, and for directing the selected ionised precursor to the substrate.

11. Apparatus for performing chemical vapour deposition comprising:

a plurality of sources, each of which is operable to produce an ionised vapour of precursor and includes means for atomising liquid precursor from which said vapour is produced, a chamber for containing a substrate onto which ionised vapour is to be deposited, a plurality of vapour paths coupling the respective sources to the chamber, and, in each path, means for selecting, by mass spectrometry, ionised precursor to be deposited on the substrate, and for directing the selected ionised precursor to the substrate.

12. Apparatus for performing chemical vapour deposition comprising:

a plurality of sources, each of which is operable to produce an ionised vapour of precursor and each including means for atomising liquid precursor from which said vapour is produced and heater means for vapourising said atomised precursor by heating said atomised precursor.

a chamber for containing a substrate onto which ionised vapour is to be deposited, a plurality of vapour paths coupling the respective sources to the chamber, a flow control electrode in each path, and means connected to each electrode, for applying a flow control potential thereto for controlling the flow of the ionised vapour in its associated path.

13. Apparatus for performing chemical vapour deposition, including electrostatic means for atomising and ionising a liquid precursor, means for vapourising the atomised ,ionised precursor after said atomised ,ionised precursor leaves said electrostatic means, and means for depositing the vapourised precursor on a surface.

* * * * *